(12) United States Patent
Nakamura

(10) Patent No.: US 6,916,373 B2
(45) Date of Patent: Jul. 12, 2005

(54) SEMICONDUCTOR MANUFACTURING METHOD

(75) Inventor: Koji Nakamura, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 38 days.

(21) Appl. No.: 10/449,492

(22) Filed: Jun. 2, 2003

(65) Prior Publication Data

US 2004/0011281 A1 Jan. 22, 2004

(30) Foreign Application Priority Data

Jul. 18, 2002 (JP) .......................................... 2002-209199

(51) Int. Cl.[7] .............................................. C30B 25/12
(52) U.S. Cl. ............................ 117/97; 117/94; 117/101; 117/106; 117/902
(58) Field of Search ............................ 117/97, 94, 101, 117/106, 902

(56) References Cited

U.S. PATENT DOCUMENTS

| 3,763,379 A | * | 10/1973 | Ashikawa et al. ............. 377/79 |
| 4,633,476 A | * | 12/1986 | Scifres et al. ................... 372/45 |
| 6,014,979 A | * | 1/2000 | Van Autryve et al. ........ 134/1.1 |

FOREIGN PATENT DOCUMENTS

| JP | 59-228714 | 12/1984 |
| JP | 62-262417 | 11/1987 |
| JP | 04-162615 | 6/1992 |
| JP | 07-058035 | 3/1995 |
| JP | 07-273025 | 10/1995 |
| JP | 10-256200 | 9/1998 |
| JP | 2000-021788 | 1/2000 |

OTHER PUBLICATIONS

R.W. Hoffman, Jr., "Wavelength Control of InGaAsP Laser Structures Using In–Situ Emissivity Corrected Pyrometry Temperature Control During MOCVD Growth," 2001 International Conference on Indium Phosphide and Related Materials, Post Deadline Papers, 13th IPRM 14–18, May 2001, Nara, Japan, pp. 15 and 16.

* cited by examiner

*Primary Examiner*—Robert Kunemund
(74) *Attorney, Agent, or Firm*—Volentine Francos & Whitt, PLLC

(57) ABSTRACT

A method for manufacturing a semiconductor using a wafer carrier, wherein the temperature of a wafer can be made uniform with few differences in surface composition distribution. A plurality of grooves are formed at the bottom of a wafer pocket of a wafer carrier, to make uniform the temperature of the wafer surface by diffusing heat. The grooves are deeper at the peripheral part of the wafer than at the central part, and groove density is higher at the peripheral part than at the central part. The groove patterns may include a plurality of wedge-shaped grooves widening from the central part toward the peripheral part, a plurality of circular grooves with narrowing interval therebetween from the central part toward the peripheral part, circular grooves with the diameter shortened from the central part toward the peripheral part, and square grooves with shortened sides from the central part toward the peripheral part.

19 Claims, 2 Drawing Sheets

SEMICONDUCTOR MANUFACTURING METHOD

BACKGROUND OF THE INVENTION

1. Field of the Invention

The present invention relates to a method for manufacturing a semiconductor by using a crystal growth apparatus in which a crystal growth is carried out by decomposing a source gas thermally on a wafer heated to reach a high temperature, especially by using a vertical MOVPE (Metal Organic Vapor Phase Epitaxy) apparatus of high speed revolution type.

2. Description of the Related Art

In the crystal growth using the MOVPE apparatus, the following document is disclosed as a method for improving an uniformity within a surface of a wafer of a growth layer: document "2001, International Conference on Indium Phosphide and Related Materials Post Deadline Papers pp.15–16. 13th IPRM 14–18, May 2001 Nara, Japan".

Recently, since an epitaxial wafer, which is a wafer with a thin film layer grown thereon, is used in most electronic devices, a mass production technology of the epitaxial wafer is indispensable. VPE (Vapor Phase Epitaxy), MBE (Molecular Beam Epitaxy), MOVPE and so on are currently in practical use as an epitaxial growth technology.

In the epitaxial growth technology, the MOVPE to be described in the present invention is a method for growing a thin film crystal of chemical compound semiconductor on a wafer by reacting III-group organic metal with V-group gas on the heated wafer. In order to mass-produce by using this MOVPE, a multi-charge method to grow a plurality of crystals at the same time is indispensable, and one of the methods in practical use currently is the method of vertical and high speed revolution type. In this method of vertical and high speed revolution type, since the crystal is grown uniformly inside the wafer surface by charging the wafer surface and by flowing a reaction gas vertically, that is, in a longitudinal direction, a susceptor holding the wafer is made to revolve.

During crystal growth, however, the temperature distribution of the surface of the wafer in which the crystal is actually grown becomes different according to the thermal conduction of a wafer holder. And then, the following problems occur: the efficiency of a source gas decomposition on the surface of the wafer changes; the composition also changes sensitively; and the uniformity within the surface deteriorates due to the difference of composition distribution within the surface.

In the document mentioned above, using the change of band gap wavelength with the change of composition due to the temperature, and relating to a method for controlling wave length in the crystal growth using the MOVPE apparatus, there is disclosed a method for improving the uniformity by controlling the wavelength within the surface after improving controllability by controlling directly the change of temperature owing to the type of gas introduced and the change of flow rate.

In order to examine the temperature distribution within the surface of the wafer, a PL (Photo Luminescence) peak wavelength is actually measured when a four element mixed crystal of indium gallium arsenic phosphorous (InGaAsP) with the band gap wavelength of 1.3 micrometers is grown by the MOVPE apparatus. The PL is to measure an impurity level contained in the crystal by observing a light emitted from a semiconductor, changing the wavelength of light radiated to the semiconductor. In this case, a band gap wavelength distribution within the surface of the wafer can be obtained.

In this band gap wavelength distribution, that is, the composition distribution, the wavelength is long at the central part and shifts to be short as nearing the peripheral part of the wafer with the shape of concentric circle or almost the same shape. There can be recognized that the temperature distribution within the wafer surface becomes higher by approximately 3–4° C. as shifting from the central part to the peripheral part of the wafer, by inversely converting the wavelength distribution from the dependence on growth temperature of the band gap wavelength.

SUMMARY OF THE INVENTION

The present invention has been achieved in view of aforementioned problems. The object of the present invention is to provide a novel and improved method for manufacturing a semiconductor in which the temperature of the surface of the wafer can be made uniform and which enables excellent uniformity within the surface with few differences of the composition distribution.

In an aspect of the present invention to achieve the above object, there is provided a method for manufacturing a semiconductor wherein a crystal growth is carried out by using a jig for crystal growth with a plurality of grooves that are formed to make uniform the temperature of the surface of the wafer by diffusing heat, at the part to mount a wafer on a wafer carrier inside a crystal growth apparatus chamber, at the bottom of a spot facing part, for example. Preferably, the depth of the plurality of grooves is deeper at the peripheral part of the wafer than at the central part of the wafer. Also preferably, the density of the plurality of grooves is higher at the peripheral part of the wafer than at the central part of the wafer.

In addition, the crystal growth may be carried out not by forming the grooves directly at the bottom of the spot facing part but by forming a plurality of grooves that are formed to make uniform the temperature of the surface of the wafer by diffusing heat, at a spacer plate placed on the spot facing part as an underlay of the wafer.

Further, the crystal growth may be carried out by forming directly a plurality of grooves that are formed to make uniform the temperature at the rear surface of the wafer to be mounted or by forming a plurality of grooves at an insulating film formed at the rear surface of the wafer.

There are following examples of groove patterns to make uniform the temperature of the surface of the wafer: as a first example, a groove with a plurality of wedge-shaped grooves formed widening from the central part toward the peripheral part and deepening toward the peripheral part at the same time; as a second example, a groove with a plurality of circular grooves formed narrowing the interval thereof from the central part toward the peripheral part and deepening toward the peripheral part at the same time; as a third example, a groove filled with circular grooves with the diameter shortened from the central part toward the peripheral part and deepening toward the peripheral part at the same time; and as a fourth example, a groove filled with square grooves with the side shortened from the central part toward the peripheral part and deepening toward the peripheral part at the same time.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1A:
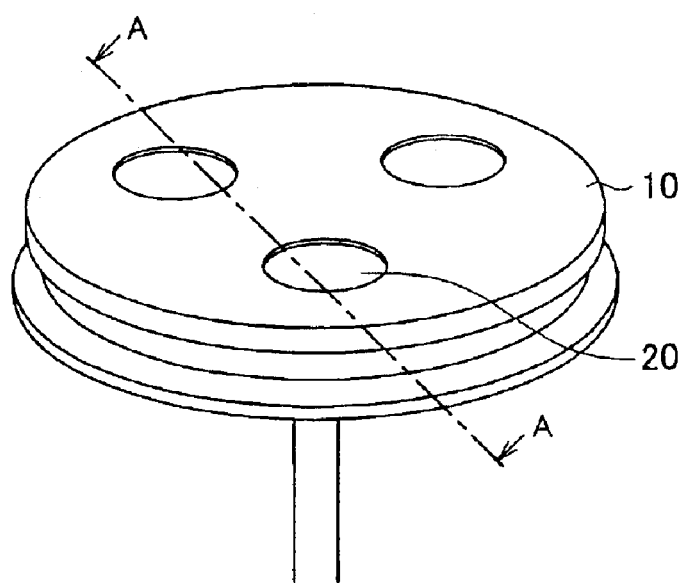
FIG. 1A is a schematic perspective view inside a chamber of a MOVPE apparatus concerning the first-fourth embodiments and FIG. 1B is a sectional view on the line A—A of a MOVPE apparatus concerning the first-fourth embodiments.

Hereinafter, the preferred embodiment of the present invention will be described in reference to the accompanying drawings. Same reference numerals are attached to components having same functions in following description and the accompanying drawings, and a description thereof is omitted.

(First Embodiment)

Figure 1B:
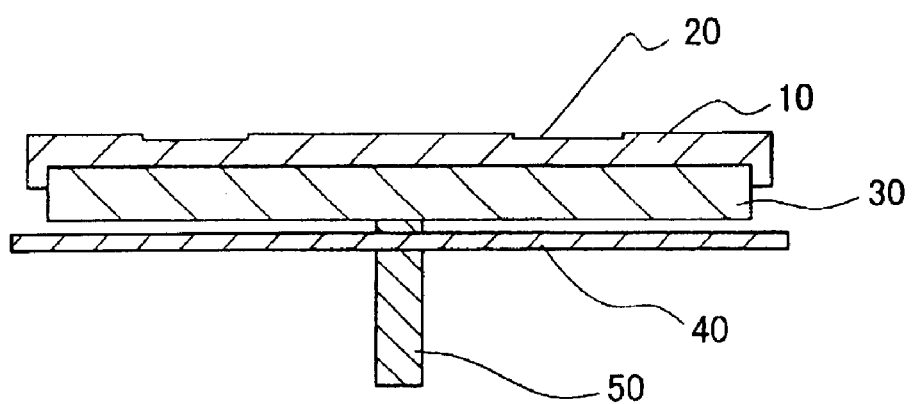

With regard to the first embodiment, a schematic perspective view inside a chamber of a vertical MOVPE crystal growth apparatus of high speed revolution type is illustrated as FIG. 1A. FIG. 1B is a sectional view showing typically on the line A—A of a MOVPE apparatus shown as FIG. 1A. Preferably, a material for a wafer carrier 10 to set a wafer is easy to be processed, capable of achieving a good thermal conduction and hard to be corroded with a material gas, such as carbon graphite and molybdenum. The wafer carrier 10, a jig for crystal growth, is placed on a susceptor 30 and heated on a heater 40 under the susceptor 30. The susceptor 30 supported by a rotation shaft 50 revolves so that the crystal growth may be uniform within the wafer carrier.

On the wafer carrier 10, a plurality of spot facing parts (hereinafter, referred to as a wafer pocket 20) to set the wafer horizontally are formed. Although FIG. 1 is illustrated so that three wafers can be grown at the same time, the same goes for any number of wafers. In the vertical MOVPE apparatus, a source gas flows in from the upper part of wafer inside the chamber to react on the heated wafer and the crystal grows. For example, when growing a four element mixed crystal of InGaAsP, such an organic metal as trimethyl indium and triethyl gallium is used as the material of In and Ga belonging to III-group element while arsine and phosphine are used as the material of As and P belonging to V-group element. And the crystal growth is carried out on the wafer by decomposing these elements thermally.

As explained in the description of the related art, the band gap wavelength distribution of a growth layer, that is, the composition distribution thereof, shows that the wavelength is long at the central part and shifts to be short as nearing the peripheral part of the wafer with the shape of concentric circle or almost the same shape. It is judged that the temperature distribution within the wafer becomes higher by approximately 3–4° C. as shifting from the central part to the peripheral part of the wafer, by converting from the dependence on growth temperature of the band gap wavelength and from the result of the wavelength distribution.

The reason for high temperature of the peripheral part of the wafer is as follows. Although thermal conduction is good at the part of the wafer pocket 20 owing to its thin part, heat is conducted from the rear surface of the wafer set at the wafer pocket 20 to the surface thereof and becomes hard to be conducted to the surface. The reason for this is that the heat conductivity of the wafer is lower than that of the wafer carrier 10, and the temperature distribution shows that the temperature becomes lower toward the central part of the wafer.

Consequently in this embodiment, assuming in advance that the thermal conduction becomes lower toward the central part of the wafer, the thermal conduction is varied to make uniform the temperature within the surface of the wafer, by processing a plurality of grooves at the bottom of the wafer pocket 20 to diffuse heat at the peripheral part of the wafer, so that the temperature distribution within the wafer may become uniform.

Examples of pattern diagrams are illustrated in FIGS. 2A–D as grooves carved at the bottom of the wafer pocket. The explanation is as follows with regard to the pattern of each groove and the structure thereof. In any patterns, the depth of the plurality of grooves formed is deeper at the peripheral part of the wafer than at the central part of the wafer while the density of the plurality of grooves formed is higher at the peripheral part of the wafer than at the central part of the wafer. Further, the grooves must be optimized according to the crystal growth apparatus and to growth condition. If filling this condition, the process inside the pocket is not limited to the examples of groove patterns shown in FIGS. 2A–D, of course.

Figure 2A:
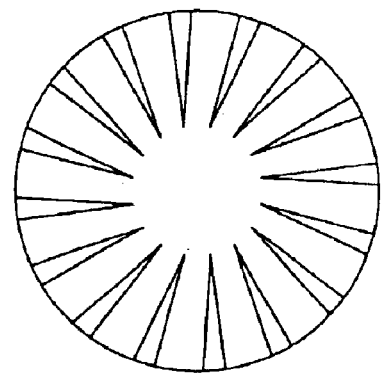
FIGS. 2a to 2d are explanatory diagram showing the pattern of groove of wafer pocket, spacer plate, the rear surface of wafer or insulating film concerning the first-fourth embodiments.

As an example of groove pattern, a pattern shown in FIG. 2A can be applied with a plurality of wedge-shaped grooves formed along the periphery circle, widening from the central part (circumference of a circle with approximately half the diameter of the periphery circle, for example) of the wafer pocket toward the peripheral part and deepening toward the peripheral part at the same time.

Figure 2B:
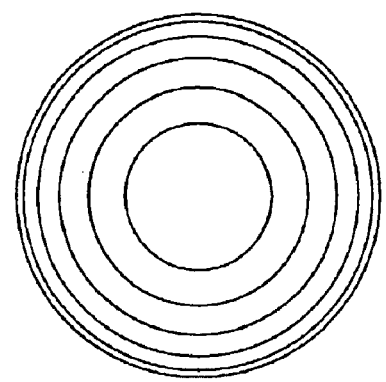

As an example of groove pattern, a pattern shown in FIG. 2B can be applied with a plurality of circular grooves formed narrowing the interval thereof from the central part (circumference of a circle with approximately half the diameter of the periphery circle, for example) of the wafer pocket toward the peripheral part and deepening toward the peripheral part at the same time.

Figure 2C:
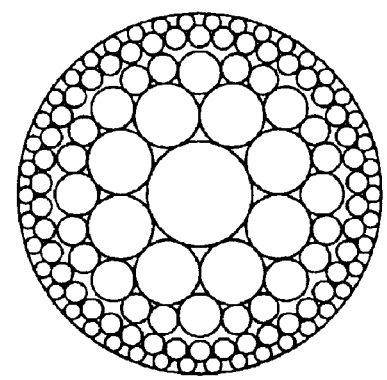

As an example of groove pattern, a pattern shown in FIG. 2C can be applied with a groove filled with circular grooves with the diameter shortened from the central part (a circle located at the center of the periphery circle, with approximately one-third of the diameter of the periphery circle, for example) of the wafer pocket toward the peripheral part and deepening toward the peripheral part at the same time.

Figure 2D:
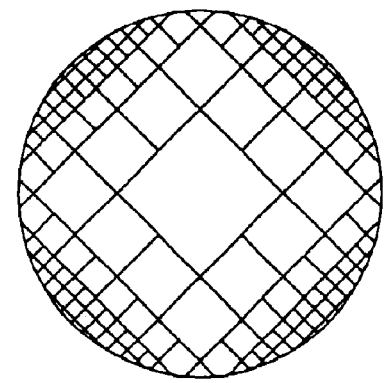

As an example of groove patterns, a pattern shown in FIG. 2D can be applied with a groove filled with square grooves with the side shortened from the central part (a square located at the center of the periphery circle, having a side with the length of approximately one-third of the diameter of the periphery circle, for example) of the wafer pocket toward the peripheral part and deepening toward the peripheral part at the same time.

By setting the wafer at the wafer pocket having grooves processed as described above in the MOVPE, the crystal growth is carried out. The method for crystal growth and the kind of growth film are to be designed according to an apparatus to be used and an object of using. Also, the growth condition needs to be designed in accordance with the process of the wafer pocket.

As the difference of temperature distribution of the surface of the wafer is reduced and the uniformity of thermal decomposition of the source gas on the surface thereof is improved, owing to a grooving process inside the pocket, the crystal composition also becomes capable of growing uniformly. At this time, since the thermal decomposition of V-group source gas is empirically changed due to the change of temperature distribution, the composition distribution changes due to the change of take-in factor. However, since it is known that the take-in factor of III-group source gas for deciding a growth thickness does not change so much, the distribution of thickness does not change.

(Second Embodiment)

In the second embodiment, a groove is formed on a spacer plate placed on the wafer pocket without making the grooving process directly on the wafer pocket as in the first embodiment. The spacer plate with the grooving process made thereon is mounted on the wafer pocket, on which the wafer is set. Preferably, a material for the spacer plate is high purity carbon and molybdenum, or a semiconductor wafer such as indium phosphide (InP), gallium arsenide (GaAs) and silicon (Si).

FIGS. 2A–D can be applied as a pattern diagram of groove on the spacer plate at this time. A plurality of grooves are formed on the spacer plate without making the grooving process on the wafer pocket. The depth of the plurality of grooves is deeper at the peripheral part of the spacer plate than at the central part thereof while the density of the plurality of grooves is higher at the peripheral part of the spacer plate than at the central part thereof. With regard to the groove patterns, a detailed explanation is to be omitted since it is the same as in the first embodiment.

In this embodiment as in the first embodiment, as the difference of temperature distribution of the surface of the wafer is reduced and the uniformity of thermal decomposition of the source gas on the surface thereof is improved, the crystal composition also becomes capable of growing uniformly. In the first embodiment, however, since a product is subject to accumulate on the groove formed on the wafer pocket due to the gas flowing into the rear surface of the wafer in the crystal growth process, it becomes necessary to replace or clean the wafer carrier. On the contrary in this embodiment, since it is sufficient to replace or clean the spacer plate, the versatility improves.

By mounting the spacer plate with the grooving process made, on a normal wafer pocket, and by setting the wafer on the spacer plate, the crystal growth is carried out in the vertical MOVPE apparatus of high speed revolution type. The method for crystal growth and the kind of growth film are to be designed according to an object of using. As for the growth condition, it is necessary to consider the growth temperature, the gas flow rate and the like since the crystal grows on the wafer on the spacer plate.

(Third Embodiment)

In the first and second embodiments, a process is made on a jig in the MOVPE apparatus. In this third embodiment, on the other hand, a groove is formed directly on the rear surface of the wafer in order to make uniform the thermal conduction. The same pattern as the one shown in FIGS. 2A–D can be applied as the processing pattern of groove at this time. In the case of an element manufactured by using a normal crystal growth wafer, since a rear polishing is carried out in the final step of manufacturing the wafer to make the wafer thin-film, the element is not affected as a chip even if forming the groove on the rear surface.

A groove is formed having the pattern to uniform the thermal conduction, on the rear surface of the wafer before the crystal starts growing, by using a photolithography step and an etching step that are used generally in processing a surface of wafer conventionally. Patterning the groove by a photoresist by using a mask for patterning and the like, and carrying out wet or dry etching, a plurality of grooves are formed. The depth of the plurality of grooves is deeper at the peripheral part of the wafer than at the central part thereof while the density of the plurality of grooves is higher at the peripheral part of the wafer than at the central part thereof. With regard to the groove pattern, a detailed explanation is to be omitted since it is the same as in the first and second embodiments.

In this embodiment, it is unnecessary to process the wafer carrier to make uniform the temperature distribution and to prepare the spacer plate. Since a pattern groove is formed directly on the wafer, a heat distribution does not change due to the product accumulating on the groove during the crystal growth, to improve the reproducibility of crystal growth. In addition, since the rear groove disappears in the end during the rear polishing process, the assembly process and the characteristics are not affected.

After forming the groove on the rear surface of the wafer as described above, and then setting the wafer at a normal wafer carrier pocket, the crystal growth is carried out in the vertical MOVPE apparatus of high speed revolution type under the growth condition considering the rear groove. The method for crystal growth and the kind of growth film are to be designed according to an object of using.

(Fourth Embodiment)

In this fourth embodiment, by forming an insulating film on the rear surface of the wafer and forming the same groove as in the third embodiment on the insulating film in order to make uniform the thermal conduction, the difference of composition distribution is reduced. The groove pattern at this time is also the same as shown in FIGS. 2A–D. In addition, the rear insulating film can be easily etched after the crystal growth.

An insulating film such as a silicon oxide film is formed on the rear surface of the wafer before the crystal starts growing, by using a CVD method. After that, a groove is formed having the pattern to uniform the thermal conduction, on the insulating film by using a photolithography step and an etching step. Patterning the groove by a photoresist by using a mask for patterning and the like, and carrying out wet or dry etching, a plurality of grooves are formed on the insulating film. The depth of the plurality of grooves is deeper at the peripheral part of the wafer than at the central part thereof while the density of the plurality of grooves is higher at the peripheral part of the wafer than at the central part thereof. With regard to the groove pattern, a detailed explanation is to be omitted since the same groove is formed on the rear surface of the wafer as in the first, second and third embodiments.

Also in this embodiment, it is unnecessary to process the wafer carrier and to prepare the spacer plate to be processed as in the third embodiment. Since a pattern groove is formed directly on the insulating film formed on the rear surface of the wafer, a heat distribution does not change due to the product accumulating on the groove during the crystal growth, to improve the reproducibility of crystal growth. In addition, since the pattern groove on the rear surface can be easily removed together with the insulating film after the crystal has grown, other wafer processes are not affected.

After forming the insulating film on the rear surface of the wafer as described above, and then setting the wafer grooved in order to uniform the thermal conduction, at a normal wafer carrier pocket, the crystal growth is carried out in the vertical MOVPE apparatus of high speed revolution type under the growth condition considering the rear insulating film. The method for crystal growth and the kind of growth film are to be designed according to an object of using.

Although the preferred embodiment of the present invention has been described referring to the accompanying drawings, the present invention is not restricted to such examples. It is evident to those skilled in the art that the present invention may be modified or changed within a technical philosophy thereof and it is understood that naturally these belong to the technical philosophy of the present invention.

Although in the embodiments the crystal growth is carried out by using a vertical MOVPE apparatus of high speed revolution type, the present invention can be applied to the case that the crystal growth is carried out by using a horizontal MOVPE apparatus of wafer rotation type into which a source gas flows in a direction horizontal to the wafer.

According to the present invention as described above, to cope with the problem that the composition distribution fails to be uniform due to the difference of temperature of the central part within the wafer surface from the peripheral part thereof in the crystal growth in the MOVPE apparatus, the thermal conduction distribution in the crystal growth becomes uniform and a crystal with a uniform composition distribution within the wafer surface can be grown by forming a plurality of grooves with a low density and a shallow depth at the central part, on the wafer pocket in the apparatus or by preparing the spacer plate to be placed between the wafer carrier and the wafer, to form a plurality of grooves with the same pattern as the wafer carrier mentioned above, on the spacer plate.

Also, the thermal conduction distribution in the crystal growth becomes uniform and a crystal with a uniform composition distribution within the wafer surface can be grown by providing a step of forming a plurality of grooves with a low density and a shallow depth at the central part, on the rear surface of the wafer before the crystal starts growing or by forming the insulating film on the rear surface of the wafer, to provide a step of forming a plurality of grooves similar to the ones mentioned above, on the insulating film.

What is claimed is:

1. A method for manufacturing a semiconductor, wherein crystal growth is carried out by using a wafer carrier having a spot facing part, comprising:
    carrying out crystal growth by mounting the wafer at a bottom of the spot facing part, the spot facing part having a plurality of grooves formed therein to make a surface temperature of the wafer uniform by diffusing heat,
    wherein a depth of the plurality of grooves formed at the spot facing part is deeper at a peripheral part of the wafer than at a central part of the wafer.

2. A method for manufacturing a semiconductor, wherein crystal growth is carried out by using a wafer carrier having a spot facing part, comprising:
    carrying out crystal growth by mounting the wafer at a bottom of the spot facing part, the spot facing part having a plurality of grooves formed therein to make a surface temperature of the wafer uniform by diffusing heat,
    wherein a density of the plurality of grooves formed at the spot facing part is higher at a peripheral part of the wafer than at a central part of the wafer.

3. A method for manufacturing a semiconductor, wherein crystal growth is carried out by using a wafer carrier having a spot facing part, comprising:
    carrying out crystal growth by mounting the wafer on a spacer plate placed on the spot facing part, the spacer plate having a plurality of grooves formed therein to make a surface temperature of the wafer uniform by diffusing heat,
    wherein a depth of the plurality of grooves formed in the spacer plate is deeper at a peripheral part of the wafer than at a central part of the wafer.

4. A method for manufacturing a semiconductor, wherein crystal growth is carried out by using a wafer carrier having a spot facing part, comprising:
    carrying out crystal growth by mounting the wafer on a spacer plate placed on the spot facing part, the spacer plate having a plurality of grooves formed therein to make a surface temperature of the wafer uniform by diffusing heat,
    wherein a density of the plurality of grooves formed in the spacer plate is higher at a peripheral part of the wafer than at a central part of the wafer.

5. A method for manufacturing a semiconductor, wherein crystal growth is carried out by using a wafer carrier having a spot facing part, comprising:
    forming a plurality of grooves at a rear surface of the wafer, to make a surface temperature of the wafer uniform by diffusing heat; and
    carrying out crystal growth by mounting the wafer having the plurality of grooves formed therein, on the spot facing part,
    wherein a depth of the plurality of grooves formed in the rear surface of the wafer is deeper at a peripheral part of the wafer than at a central part of the wafer.

6. A method for manufacturing a semiconductor, wherein crystal growth is carried out by using a wafer carrier having a spot facing part, comprising:
    forming a plurality of grooves at a rear surface of the wafer, to make a surface temperature of the wafer uniform by diffusing heat; and
    carrying out crystal growth by mounting the wafer having the plurality of grooves formed therein, on the spot facing part,
    wherein a density of the plurality of grooves formed in the rear surface of the wafer is higher at a peripheral part of the wafer than at a central part of the wafer.

7. A method for manufacturing a semiconductor according to claim 5, wherein the plurality of grooves are formed by using photolithography.

8. A method for manufacturing a semiconductor according to claim 5, wherein the plurality of grooves are formed by using etching.

9. A method for manufacturing a semiconductor according to claim 5, wherein the plurality of grooves are removed by carrying out polishing of the rear surface after the crystal growth.

10. A method for manufacturing a semiconductor, wherein crystal growth is carried out by using a wafer carrier having a spot facing part, comprising:
    forming an insulating film on a rear surface of the wafer;
    forming a plurality of grooves in the insulating film, to make a surface temperature of the wafer uniform by diffusing heat; and
    carrying out crystal growth by mounting the wafer having the insulating film with the plurality of grooves formed therein, on the spot facing part.

11. A method for manufacturing a semiconductor according to claim 10, wherein a depth of the plurality of grooves formed in the insulating film is deeper at a peripheral part of the wafer than at a central part of the wafer.

12. A method for manufacturing a semiconductor according to claim 10, wherein a density of the plurality of grooves formed in the insulating film is higher at a peripheral part of the wafer than at a central part of the wafer.

13. A method for manufacturing a semiconductor according to claim 10, wherein the plurality of grooves are formed by using photolithography.

14. A method for manufacturing a semiconductor according to claim 10, wherein the plurality of grooves are formed by using etching.

15. A method for manufacturing a semiconductor according to claim 10, wherein the insulating film with the plurality of grooves formed therein is removed by etching after the crystal growth.

16. A method for manufacturing a semiconductor according to claim 10, wherein the insulating film is a silicon oxide film.

17. A method for manufacturing a semiconductor according to claim 6, wherein the plurality of grooves are formed by using photolithography.

18. A method for manufacturing a semiconductor according to claim 6, wherein the plurality of grooves are formed by using etching.

19. A method for manufacturing a semiconductor according to claim 6, wherein the plurality of grooves are removed by carrying out polishing of the rear surface after the crystal growth.

* * * * *